(12) United States Patent
Sandhu et al.

(10) Patent No.: US 6,809,025 B2
(45) Date of Patent: *Oct. 26, 2004

(54) METHOD OF MAKING A VOID-FREE ALUMINUM FILM

(75) Inventors: Gurtej S. Sandhu, Boise, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/375,484

(22) Filed: Feb. 27, 2003

(65) Prior Publication Data

US 2003/0162387 A1 Aug. 28, 2003

Related U.S. Application Data

(62) Division of application No. 09/899,373, filed on Jul. 2, 2001, now Pat. No. 6,555,471, which is a continuation of application No. 09/294,771, filed on Apr. 19, 1999, now Pat. No. 6,255,212, which is a division of application No. 08/977,786, filed on Nov. 25, 1997, now Pat. No. 5,963,835, which is a division of application No. 08/802,405, filed on Feb. 18, 1997, now Pat. No. 5,844,318.

(51) Int. Cl.[7] .................... H01L 21/4763; H01L 21/44
(52) U.S. Cl. .................... 438/625; 438/624; 438/681; 438/656
(58) Field of Search .................... 438/625, 624, 438/681, 688, 629, 672, 627, 642, 643, 644, 652, 648, 656, 683, 680

(56) References Cited

U.S. PATENT DOCUMENTS 5,036,382 A   7/1991   Yamaha .................... 357/71
5,252,518 A   10/1993  Sandhu et al. .............. 437/200
5,278,449 A   1/1994   Miyakawa .................. 257/751

(List continued on next page.)

FOREIGN PATENT DOCUMENTS

| JP | 5-29316   | 2/1993  |
| JP | 5-315334  | 11/1993 |
| JP | 6-204346  | 7/1994  |
| JP | 6-275559  | 9/1994  |
| JP | 6-291191  | 10/1994 |

*Primary Examiner*—Matthew Smith
*Assistant Examiner*—Chuong A Luu
(74) *Attorney, Agent, or Firm*—Workman Nydegger

(57) ABSTRACT

A method for depositing an aluminum film limits the growth of voids and notches in the aluminum film and forms and aluminum film with a reduced amount of voids and notches. The first step of the method is to form an underlying layer upon which is deposited an aluminum film having a first thickness. The surface of the aluminum film is then exposed to a passivation species which coats the aluminum grains and precipitates at the grain boundaries so as to prevent grain movement. The exposure of the aluminum film to the passivation species reduces void formation and coalescence of the voids. An aluminum layer having a second thickness is then deposited over the initially deposited aluminum layer. In a second embodiment of the invention, the passivation species is deposited with MOCVD and to form an electromigration-resistant alloy. A third embodiment involves multiple depositions of aluminum, with exposure to a passivation species conducted after each deposition. Each deposition is also conducted at a successively lower temperature than the prior deposition.

16 Claims, 3 Drawing Sheets

U.S. PATENT DOCUMENTS

| | | | |
|---|---|---|---|
| 5,341,026 A | 8/1994 | Harada et al. | 257/764 |
| 5,341,318 A | 8/1994 | Balkanski et al. | 364/725 |
| 5,508,229 A | 4/1996 | Baker | 437/183 |
| 5,567,987 A | 10/1996 | Lee | 257/751 |
| 5,633,199 A | 5/1997 | Fiordalice et al. | 438/642 |
| 5,658,828 A | 8/1997 | Lin et al. | 438/643 |
| 5,691,571 A | 11/1997 | Hirose et al. | 257/751 |
| 5,780,323 A | 7/1998 | Forouhi et al. | 438/131 |
| 5,804,249 A | 9/1998 | Sukharev et al. | 427/99 |
| 5,844,318 A | 12/1998 | Sandhu et al. | 257/774 |
| 5,944,221 A | 8/1999 | Laing et al. | 222/54 |
| 6,016,012 A | 1/2000 | Chatila et al. | 257/775 |
| 6,025,269 A | 2/2000 | Sandhu | 438/688 |
| 6,043,151 A | 3/2000 | Gonzalez et al. | 438/672 |
| 6,051,490 A | 4/2000 | Taguchi et al. | 438/618 |
| 6,054,191 A | 4/2000 | Sharan et al. | 427/534 |
| 6,063,703 A | 5/2000 | Shinriki et al. | 438/653 |
| 6,255,212 B1 * | 7/2001 | Sandhu et al. | 438/652 |

* cited by examiner

METHOD OF MAKING A VOID-FREE ALUMINUM FILM

This application is a divisional of U.S. patent application Ser. No. 09/899,373, filed on Jul. 2, 2001, now U.S. Pat. No. 6,555,471 which is a continuation of U.S. patent application Ser. No. 09/294,771, filed on Apr. 19, 1999, now U.S. Pat. No. 6,255,212 B1, which is a divisional of U.S. patent application Ser. No. 08/977,786, filed on Nov. 25, 1997, now U.S. Pat. No. 5,963,835, which is a divisional of U.S. patent application Ser. No. 08/802,405, filed on Feb. 18, 1997, now U.S. Pat. No. 5,844,318, all of which are incorporated herein by reference.

BACKGROUND OF THE INVENTION

1. The Field of the Invention

The present invention relates to the formation of aluminum films. More particularly, the present invention relates to the formation of an aluminum film with a reduced occurrence and size of voids in a process suitable for forming contacts, vias, and metal interconnect lines situated on a semiconductor substrate assembly.

2. The Relevant Technology

Integrated circuits are manufactured by an elaborate process in which a variety of different semiconductor devices are integrally formed on a small silicon wafer. Conventional semiconductor devices include capacitors, resistors, transistors, diodes, and the like. In advanced manufacturing of integrated circuits, hundreds of thousands of semiconductor devices are formed on a single wafer.

One step in the manufacture of integrated circuits is to form metal interconnect lines between the discrete semiconductor devices on the integrated circuit. The metal interconnect lines allow for an electrical current to be delivered to and from the semiconductor devices so that the integrated circuit can perform its intended function.

The metal interconnect lines generally comprise narrow lines of aluminum etched from an aluminum film. Aluminum is typically used because it has relatively low resistivity, good current-carrying density, superior adhesion to silicon dioxide, and is available in high purity. Each of these properties is desirable in contact lines since they result in a faster and more efficient electronic circuit.

A further step in which aluminum films are used and which is frequently conducted in the manufacturing of integrated circuits is the formation of inter-level interconnect structures between nonadjacent layers on the integrated circuit wafer. These inter-level interconnect structures include contacts, plugs, and vias. An example of an interconnect structure in the form of a contact is shown in FIG. 1. In FIG. 1, a contact is shown with a contact opening 14 extending through a passivation layer 12 down to a silicon substrate assembly 10. A substrate assembly is intended herein to mean a substrate having one or more layers or structures thereon. Contact opening 14 is filled with a titanium nitride diffusion barrier 15 and a film of aluminum 16.

One complication arising from the use of aluminum films is the phenomenon referred to as "void formation." Void formation is a process in which minute voids 18, shown in FIG. 1, form between grain boundaries as grains move and grow as a result of heat treatments following metal deposition. Void formation is believed to stem from the solid phase growth of aluminum crystals as the film becomes thicker during deposition. Crystal growth causes grain boundary movement and gives rise to voids and notches at the interface between two adjacent grains. The voids, also known as "notches," coalesce at flux divergence sites such as grain boundary triple points of a metal interconnect line, contact, or via. Voids cause a heightened resistivity in the aluminum film, thereby reducing the effectiveness of the aluminum film in providing electrical communication.

Void formation is accompanied by a phenomenon known as electromigration. Electromigration occurs as an electrical current flows through an aluminum portion of an interconnect line, contact, via, or other structure. When a voltage is applied across the aluminum, electrons begin to flow through the aluminum. These electrons impart energy to the aluminum atoms sufficient to eject aluminum atoms from their lattice sites. As the aluminum atoms become mobile, they leave behind vacancies. In turn, the vacancies are also mobile, since they can be filled by other aluminum atoms which then open new vacancies. In the phenomenon of electromigration, the vacancies formed throughout the aluminum line tend to coalesce at the grain boundary triple points of the metal line, thereby also helping to form voids.

In a further complication, voids 18 tend to coalesce due to increased movement of the grains at higher temperatures to form large-scale voids 20, as shown in FIG. 2. Large-scale voids 20 severely limit conductivity and can cause failure of the interconnect, via, or contact. This can result in the failure of the semiconductor device as a whole and failure of the entire integrated circuit. This problem occurs more frequently and is increasingly problematic at greater miniaturization levels due to the smaller size of the structures in relation to large scale voids.

In one attempt to eliminate void formation, aluminum is mixed with other metals to form an aluminum alloy. For example, copper is frequently added to aluminum. The addition of copper increases the energy required to cause the voids to form in the metal interconnect line. Titanium and other metals are also frequently deposited together with the aluminum, which metals are then alloyed to the aluminum in a high temperature anneal process flow step. Alloying is only a partial remedy, however, as void formation still continues to occur over time, especially as the size of aluminum features decrease.

To ensure adequate coverage of aluminum films, which is desirable in filling high aspect ratio via and contact holes, and in maintaining low contact resistance and consistent etching, the prior art has turned to cold wall CVD aluminum deposition processes. One example of this is organometallic chemical vapor deposition (MOCVD) using dimethyl aluminum hydride (DMAH). When so doing, a base layer of titanium nitride is typically deposited by chemical vapor deposition prior to the deposition of the aluminum film. The base layer of titanium nitride assists in the process of achieving uniform nucleation of the aluminum film. While this process is somewhat beneficial, the deposited aluminum films continue to exhibit voids 18 in aluminum film 28 and at the aluminum-titanium nitride interface due to grain growth, an illustration of which appears in FIG. 3.

FIG. 3 shows a substrate 10 subjacent to a passivation layer 22 composed of, for example, BPSG or $SiO_2$. A titanium nitride base layer 26 is formed over passivation layer 22 and is subjacent an aluminum film 28. A plurality of voids 18 have formed in aluminum film 28 and at an interface 24 between titanium nitride base layer 26 and aluminum film 28. Voids 18 result in increased resistance in aluminum film 28, reliability problems of integrated circuits being formed by the structure of FIG. 3, and ultimately device failure that results in lowered yield rates of the process by which the integrated circuits are manufactured.

As a result of the above discussion, it is apparent that a need exists in the art for a method of aluminum film deposition which can be used to form uniform aluminum films with substantially eliminated or arrested void formation. Such a method would be additionally beneficial if it could be used for forming aluminum interconnect lines and inter-level interconnect structures, if it could be used with alloying processes, and if it could provide reduced electromigration.

SUMMARY OF THE INVENTION

In accordance with the invention as embodied and broadly described herein in the preferred embodiment, a method is provided for depositing aluminum films with a reduced occurrence and size of voids and notches. The method comprises in a first step, forming an underlying layer. One preferred underlying layer is titanium nitride which is deposited in a conventional manner.

In a further step, aluminum of a predetermined first thickness is deposited over the titanium nitride underlayer. The first thickness of aluminum is typically between about one third and one half of the total desired thickness of the aluminum film being deposited. The aluminum is preferably deposited with a cold wall chemical vapor deposition process, but could be deposited using any suitable process. The surface of the first thickness of aluminum is then exposed to a passivation species which coats the aluminum grain and precipitates at the grain boundaries. The passivation species comprises compounds such as $O_2$, $N_2$, $TiCl_4$, TDMAT, $SiH_4$, $GeH_4$, as well as members of the halogen and interhalogen families of gases. Other species which achieves surface passivation can also be used.

In a further step, an aluminum film having a second thickness is deposited over the aluminum film having the first thickness. In the basic embodiment, the second thickness of the later deposited aluminum film comprises the remainder of the final thickness of the aluminum film desired to be formed.

The passivation species to which the surface of the aluminum film having the first thickness is exposed causes friction between the aluminum grains, both chemically and mechanically, so as to arrest and make the grains of the aluminum at the surface immobile. Immobilizing the grains causes a reduction in movement across grain boundaries and a suppression of grain growth. This in turn inhibits voids from forming and prohibits voids that do form from coalescing to form large-scale voids. The result is an aluminum film with a reduced amount of voids and notches from the prior art and with a reduced coalescence of the voids that are present.

In a second embodiment, the passivation species is deposited with CVD as organometallic chemical vapor deposition (MOCVD). The passivation species used in the second embodiment may comprise, for instance, Ti, TiN, $TiC_xN_y$, $TiC_xN_yO_z$, Cu, Sc, C, Si, Ge, and Sb. The MOCVD deposited passivation species achieves surface passivation as described above, and in addition, forms an alloy with the adjoining aluminum films, thereby improving electromigration resistance.

A third embodiment involves multiple depositions of aluminum. Under this embodiment, an aluminum film having a first thickness is deposited and then passivated in the manner discussed above. An aluminum film having a second thickness is deposited and is also passivated. Additional aluminum films are then subsequently deposited, each having a predetermined thicknesses. A layer of passivation species is deposited after each aluminum film deposition, and the process is repeated until the final desired thickness of a resultant composite aluminum film is obtained. Additionally, each subsequent deposition is preferably conducted at a successively lower temperature, further helping to suppress void formation and to reduce coalescence of voids into large-scale voids.

An aluminum film structure is produced by the method of the present invention, having a substrate assembly and a plurality of adjacent layers situated upon the substrate assembly. Each adjacent layer has a substantially uniform thickness and an upper surface. The upper surface has a plurality of aluminum grains that are substantially immobile such that the grain boundary movement thereof is substantially arrested. Each adjacent layer has substantially no voids larger than the thickness thereof.

The aluminum film produced by the method of the present invention is highly suitable for forming metal interconnect lines and for forming inter-level interconnect structures down to semiconductor devices on a substrate assembly. The aluminum film has less voids and notches than if the passivation species were not used, and any voids and notches that do exist will not cross over the boundaries between the discrete layers laid by the multiple deposition steps. This in turn limits the maximum diameter of voids that can occur to the thickness of any of the discrete layers.

The above discussion illustrates several embodiments of a method for forming aluminum films. The method is suitable for use in forming aluminum interconnect lines, contacts, vias, and for other aluminum film applications. The method provides an interface with reduced occurrence and size of voids and notches, reduced electromigration, and increased conductivity. Faster device speeds and improved yield rates are also a result of the inventive method.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE INVENTION

Figure 1:
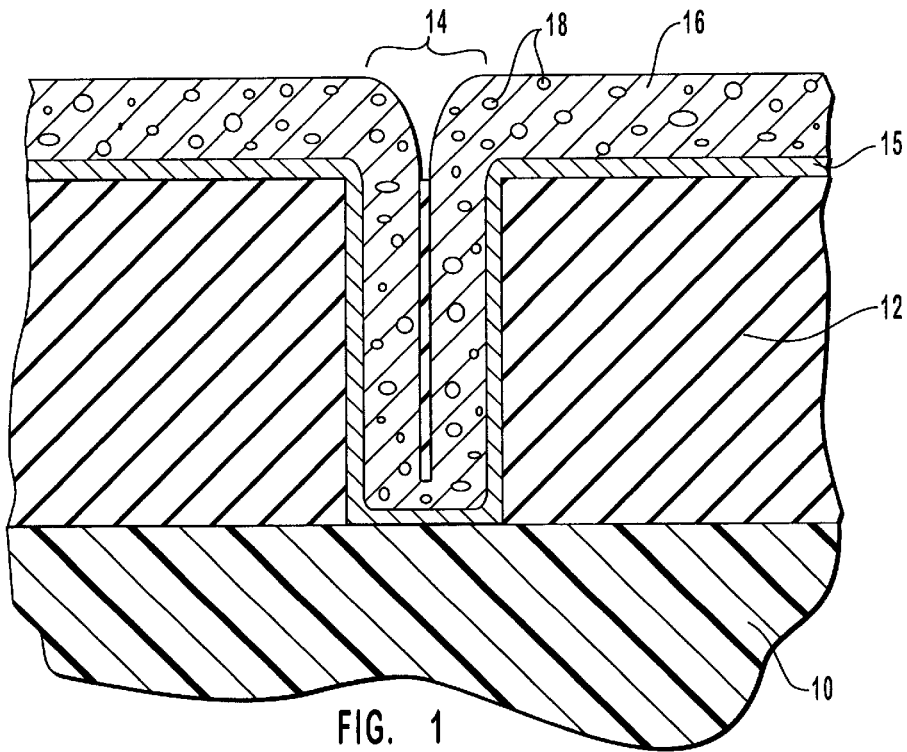
FIG. 1 is a cross-sectional depiction of a contact opening filled by an aluminum film on an in-process integrated circuit wafer, showing the occurrence of voids within the aluminum film of the contact opening.
Figure 2:
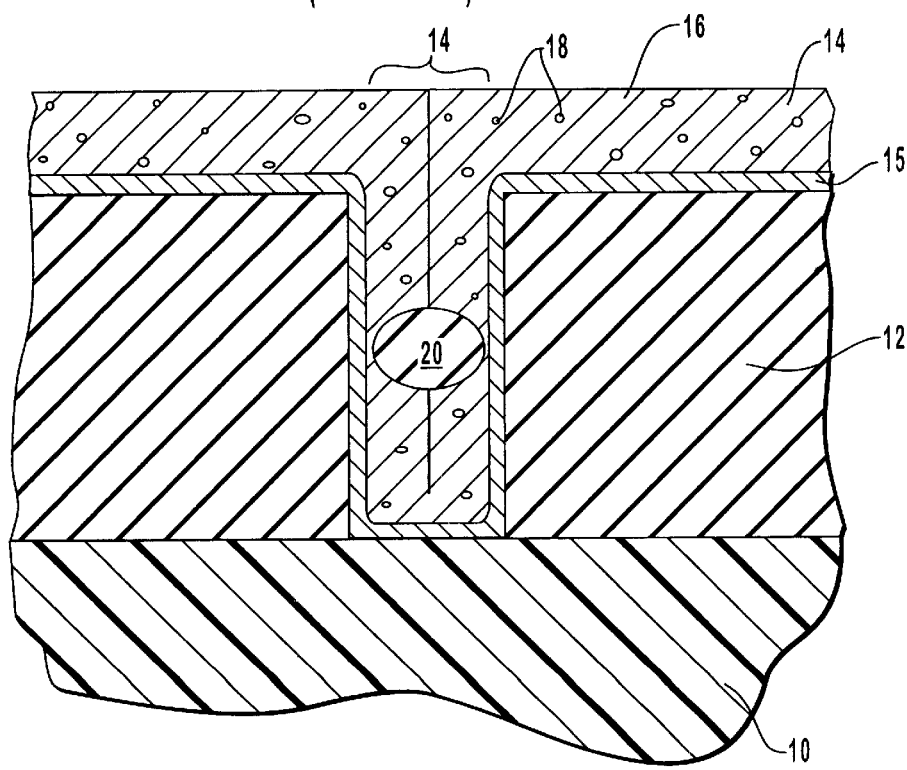
FIG. 2 is a cross-sectional depiction of the contact opening of FIG. 1 after higher temperature processes have been conducted and showing the coalescence of the voids into a larger void.
Figure 3:
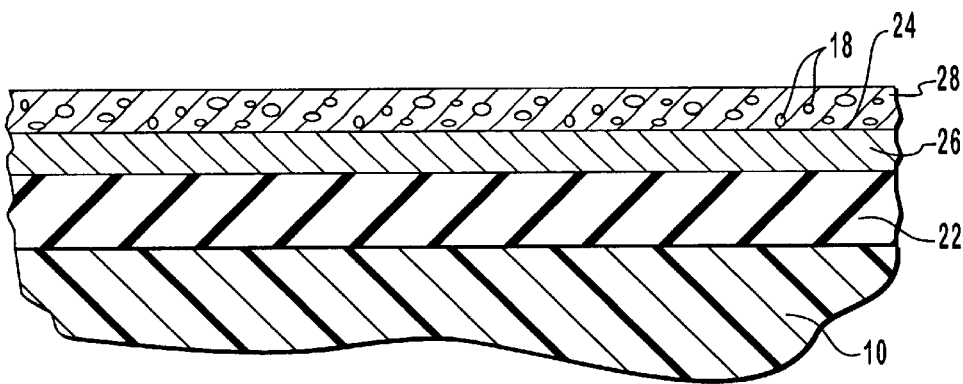
FIG. 3 is a cross-sectional depiction of a film of aluminum deposited under a method of the prior art and showing voids at the interface between aluminum and titanium nitride layers.
Figure 4:
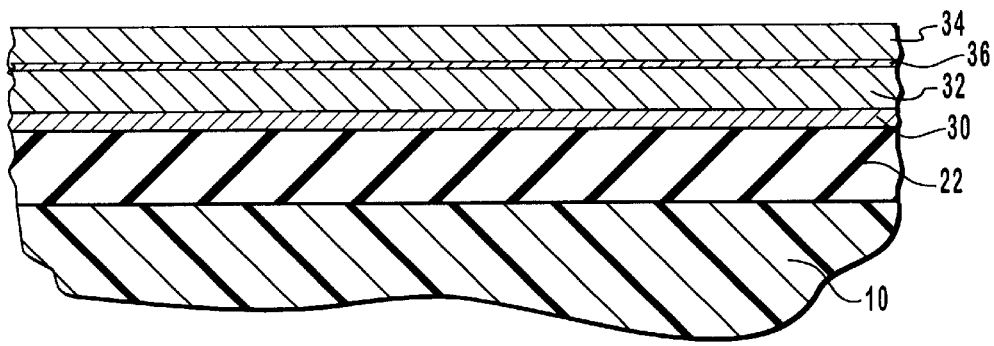
FIG. 4 is a cross-sectional depiction of an aluminum film deposited under a basic embodiment of the method of the present invention.

The method of the present invention will be described in several embodiments illustrated in FIGS. 4 through 6 of the accompanying drawings. The first step of the present invention is illustrated in FIG. 4 and comprises the deposition of an underlying layer 30 on a substrate assembly 10. Substrate assembly 10 typically comprises a substrate upon which may be formed one or more structural layers. In the depicted embodiment, substrate assembly 10 comprises a silicon substrate of an in-process integrated circuit wafer. Underlying layer 30 preferably comprises titanium nitride, and in the depicted embodiment, is formed over a passivation layer 22 of BPSG or $SiO_2$.

Figure 6:
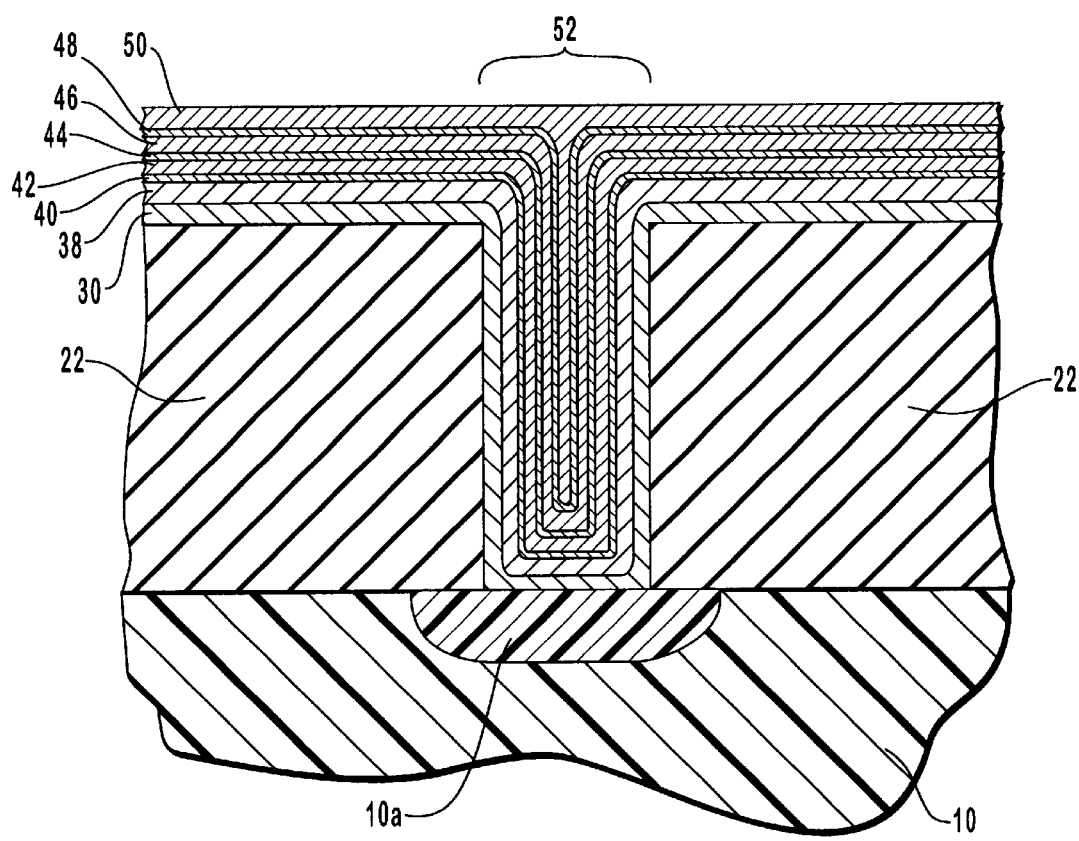
FIG. 6 is a cross-sectional depiction of a contact opening filled with an aluminum film in accordance with the second embodiment of the method of the present invention.

When the aluminum film is being used to form a contact or via, as in the embodiment of FIG. 6, a contact opening 52 is first formed through passivation layer 22 down to an underlying active region, semiconductor device, or other such surface which otherwise must be electrically interconnected with a surface layer. In such an application, underlying layer 30 is then deposited in contact opening 52 to serve as a diffusion barrier.

Returning to the planar film embodiment of FIG. 4 for discussion purposes, after underlying layer 30 is deposited, an aluminum film 32 having an initial thickness of a fraction of the final desired thickness of aluminum film 32 is deposited over underlying layer 30. Aluminum film deposition is preferably conducted with a cold wall CVD process such as that described above, though it should be apparent to one skilled in the art that any suitable deposition process could be used. The thickness of aluminum layer 32 is preferably about one third to one half of the final thickness of the aluminum film which is desired to be deposited.

In a further step, the surface of aluminum film 32 is exposed to a species which achieves surface passivation. The passivation species is preferably deposited as a passivation layer 36 which coats at least the top surface of aluminum film 32. Passivation layer 36 can also be allowed to penetrate into aluminum film 32 to pacify portions of aluminum film 32 beyond the top surface.

Examples of suitable passivation species comprise $O_2$, $N_2$, $TiCl_4$, tetradimethylaminotitanium (TDMAT) $SiH_4$, $GeH_4$, along with members of the halogen and interhalogen families of gases. The passivation species is deposited in such a manner as to at least partially coat the aluminum grains. This will allow the passivation species to precipitate in the grain boundaries, and thereby cause friction and the freezing in place of the grains of aluminum film 32. Further grain growth during subsequent aluminum film deposition is arrested as a result. Arresting the movement of the grains of aluminum film 32 substantially reduces the formation of voids as well as the coalescence of voids into large-scale voids.

An aluminum film 34 having a second thickness is then deposited over aluminum film 32. The second thickness of aluminum film 34, in the basic embodiment of the invention, makes up the balance of the final thickness of the aluminum film which is desired to be deposited.

Alternative embodiments are also provided in the present invention. In one alternative embodiment, the passivation species comprises a material such as Ti, Cu, C, TiN, $TiC_xN_y$, $TiC_xN_yO_z$, Si, Ge, Sc, and Sb, etc. which combines and alloys with the aluminum to not only passivate the surface, but also to reduce electromigration. The passivation species in this embodiment is preferably deposited with an organometallic chemical vapor deposition (MOCVD) process. Thus, under this embodiment, underlying layer 30 and aluminum film 32 are deposited as discussed above in reference to the embodiment of FIG. 4, and passivation layer 36, selected from the aforementioned alternate group of materials, is deposited with MOCVD. As a consequence, when depositing second thickness of aluminum 34, the selected passivation species will alloy into second thickness of aluminum, and to a lesser extent, into initial aluminum film 32, thereby causing increased electromigration resistance in both films.

In a further alternative embodiment of the method of the present invention, the deposition of aluminum is conducted in multiple steps. The initial thickness of aluminum is deposited at a higher temperature, and each deposition step is conducted at a successively lower temperature. This causes a reduction in size of the grains of the aluminum film, thereby reducing voiding and film stress and preventing grain growth in the portions of the aluminum film which have been deposited during prior steps.

Figure 5:
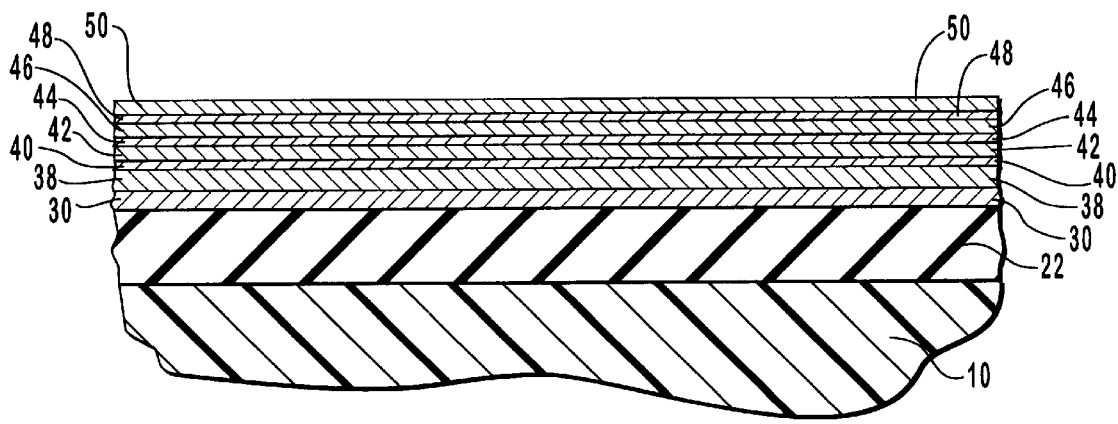
FIG. 5 is a cross-sectional depiction of aluminum film deposited under a a basic embodiment of the method of the present invention.

This embodiment is illustrated in FIG. 5. As seen in FIG. 5 therein, an initial aluminum film 38 is deposited over underlying layer 30. A passivation species in the form of passivation layer 40 is then deposited over initial aluminum film 38 in order to suppress the formation and coalescence of voids. Subsequently thereafter, successive aluminum films represented in FIG. 5 as aluminum films 42, 46, and 50 are deposited with intervening passivation layers 44 and 48. The passivation species used to form passivation layers 40, 44, and 48 can be the same or may vary according to the inventive method.

In one example, given by way of illustration and not intended to be restrictive, initial aluminum film 38 is deposited with a thickness of about 1000 angstroms at a temperature of about 250° C. Successive aluminum films 42, 46, and 50 are deposited with a thickness of about 200 angstroms at a temperature of about 150° C. Successive depositions are conducted with intervening passivation layer deposition until the accumulated thickness of aluminum reaches about 3000 angstroms.

FIG. 6 illustrates a further embodiment of the method of the present invention. In the embodiment of FIG. 6, an inter-level interconnect structure in the form of a contact opening 52 is metallized with an aluminum film formed under the method of the present invention. Contact opening 52 electrically interconnects an active device 10a, which in the depicted embodiment comprises a junction of a MOS semiconductor transistor. Under this embodiment, contact opening 52 is metallized in multiple steps in accordance with the discussion of FIG. 5, wherein aluminum films 38, 42, 46, and 50 are deposited with the successive intervening deposition of surface passivation layers 40, 44, and 48 to result in the inter-level interconnect structure of FIG. 6.

The size of voids that can occur in the resulting contact structure of FIG. 6 are limited to the thicknesses of each of aluminum films 38, 42, 46, and 50. That is, passivation layers 40, 44, and 48 will prohibit coalescence of voids that intersect the boundaries between aluminum films 38, 42, 46, and 50. This in turn limits the maximum diameter of the voids that can occur in contact opening 52 to a diameter of the same dimension as the thickness of any one of aluminum films 38, 42, 46, and 50. Such is also the case when planar films are formed as in the structures of FIGS. 4 and 5. Thus, if each of aluminum films 38, 42, 46, and 50 are of uniform thickness and together fill contact opening 52, substantially no voids will result that have a diameter exceeding the diameter of contact opening 52 divided by the number of aluminum films, in this case, four.

The above discussion illustrates several embodiments of a method for forming an aluminum film. The aluminum film is suitable for forming inter-level interconnect structures such as aluminum interconnect lines, contacts, vias, as well as other aluminum film structures where a need exists for a reduced occurrence of voids and notches, reduced electromigration, and increased conductivity. The inventive method has been found to promote faster device speeds as well as improved yield rates as compared to conventional aluminum film deposition.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of forming a contact structure, the method comprising:

providing a semiconductor substrate assembly having a junction therein;

providing an electrical insulation layer upon the semiconductor substrate assembly, said electrical insulation layer having a contact hole, the contact hole having a side wall and terminating at a contact surface on the junction in the semiconductor substrate assembly; and forming a pair of films within the contact hole, said pair of films including:
a film comprising aluminum having aluminum grains; and
a film comprising a passivation material that coats the aluminum grains.

2. The method of claim 1, further comprising, prior to forming said pair of films within the contact hole:

forming a refractory metal nitride on the side wall of the contact hole and on the contact surface.

3. The method of claim 1, further comprising:

forming a plurality of said pair of films within the contact hole.

4. The method of claim 3, further comprising:

repeating forming said plurality of said pair of films within the contact hole until the contact hole is filled by the plurality of said pair of films.

5. The method of claim 3, wherein:

the contact hole has a diameter;

there is a uniform thickness for each said film comprising aluminum;

each said film comprising aluminum includes a void therein, said void having a width; and the sum of the widths of the voids in the films comprising aluminum is not greater than the diameter of the contact hole.

6. The method of claim 2, wherein the refractory metal nitride comprises titanium nitride.

7. The method of claim 1, wherein the film comprising a passivation material that coats the aluminum grains is formed by exposing the film comprising aluminum to one of Ti, Cu, TiN, $TiC_xN_y$, $TiC_xN_yO_z$, Sc, C, Si, Ge, Sb, $O_2$, $N_2$, $TiCl_4$, TDMAT, $SiH_4$, and $GeH_4$.

8. A method of forming a contact structure, the method comprising:

providing a semiconductor substrate assembly having a junction therein;

providing an electrical insulation layer upon the semiconductor substrate assembly, said electrical insulation layer having a contact hole, the contact hole having a side wall and terminating at a contact surface on the junction in the semiconductor substrate assembly; and forming a pair of films within the contact hole, said pair of films including:

a film comprising aluminum having aluminum grains; and a film comprising a passivation material that coats the aluminum grains and that is formed by exposing the film comprising aluminum to one of Ti, Cu, TiN, $TiC_xN_y$, $TiC_xN_yO_z$, Sc, C, Si, Ge, Sb, $O_2$, $N_2$, $TiCl_4$, TDMAT, $SiH_4$, $GeH_4$, and members of the halogen and interhalogen families of gases.

9. The method of claim 8, further comprising, prior to forming said pair of films within the contact hole:

forming a refractory metal nitride on the side wall of the contact hole and on the contact surface.

10. The method of claim 8, further comprising:

forming a plurality of said pair of films within the contact hole.

11. The method of claim 10, further comprising:

repeating forming said plurality of said pair of films within the contact hole until the contact hole is filled by the plurality of said pair of films.

12. The method of claim 10, wherein:

the contact hole has a diameter;

there is a uniform thickness for each said film comprising aluminum;

each said film comprising aluminum includes a void therein, said void having a width; and the sum of the widths of the voids in the films comprising aluminum is not greater than the diameter of the contact hole.

13. The method of claim 9, wherein the refractory metal nitride comprises titanium nitride.

14. A method of forming a contact structure, the method comprising:

providing a semiconductor substrate assembly having a junction therein;

providing an electrical insulation layer upon the semiconductor substrate assembly, said electrical insulation layer having a contact hole, the contact hole having a side wall and terminating at a contact surface on the junction in the semiconductor substrate assembly;

forming a refractory metal nitride on the side wall of the contact hole and on the contact surface; and forming a pair of films within the contact hole, said pair of films including:

a film comprising aluminum having aluminum grains; and a film comprising a passivation material that coats the aluminum grains.

15. The method of claim 14, wherein the refractory metal nitride comprises titanium nitride.

16. The method of claim 14, wherein the film comprising a passivation material that coats the aluminum grains is formed by exposing the film comprising aluminum to one of Ti, Cu, TiN, $TiC_xN_y$, $TiC_xN_yO_z$, Sc, C, Si, Ge, Sb, $O_2$, $N_2$, $TiCl_4$, TDMAT, $SiH_4$, and $GeH_4$.

* * * * *